(12) United States Patent
Kim et al.

(10) Patent No.: US 7,659,012 B2
(45) Date of Patent: Feb. 9, 2010

(54) ORGANIC ELECTROLUMINESCENT DISPLAY DEVICE

(75) Inventors: Won-Jong Kim, Seoul (KR);
Hae-Seung Lee, Seoul (KR);
Jong-Hyuk Lee, Yongin-si (KR);
Yoon-Hyeung Cho, Youngin-si (KR);
Hyun-Jung Yang, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 406 days.

(21) Appl. No.: 11/046,797

(22) Filed: Feb. 1, 2005

(65) Prior Publication Data
US 2005/0170210 A1    Aug. 4, 2005

(30) Foreign Application Priority Data
Feb. 2, 2004    (KR) .................... 10-2004-0006586

(51) Int. Cl.
*H01L 51/54*    (2006.01)
*H01J 1/62*    (2006.01)

(52) U.S. Cl. .................. 428/690; 428/917; 313/504; 313/506; 313/512

(58) Field of Classification Search ............... 428/688, 428/446, 413, 411.1, 690, 917, 76, 323; 313/504, 313/506, 512
See application file for complete search history.

(56) References Cited

U.S. PATENT DOCUMENTS

| | | | |
|---|---|---|---|
| 5,771,562 A | 6/1998 | Harvey, III et al. ......... 29/592.1 |
| 6,268,695 B1 | 7/2001 | Affinito ....................... 313/504 |
| 6,683,122 B1 * | 1/2004 | Zilg et al. .................... 523/205 |
| 7,063,902 B2 * | 6/2006 | Kikuchi et al. .............. 428/690 |
| 2003/0039835 A1 * | 2/2003 | Tsai et al. ................... 428/404 |
| 2003/0143423 A1 * | 7/2003 | McCormick et al. ........ 428/690 |
| 2004/0058157 A1 * | 3/2004 | Ishikawa ................. 428/411.1 |
| 2004/0119403 A1 * | 6/2004 | McCormick et al. ........ 313/506 |

FOREIGN PATENT DOCUMENTS

| | | |
|---|---|---|
| CN | 1270979 | 10/2000 |
| JP | 05177782 | 7/1993 |
| JP | 07251489 | 10/1995 |
| JP | 08-236271 | * 9/1996 |
| JP | 09153395 | 6/1997 |
| JP | 2003-261091 | 9/2003 |
| JP | 2004025732 | 1/2004 |
| JP | 2004027216 | 1/2004 |
| WO | WO 96/08526 | * 3/1996 |
| WO | WO 03106582 | 12/2003 |

OTHER PUBLICATIONS

Fong et al., Chemical Materials, (2001), vol. 13, p. 4123-4129.*

(Continued)

*Primary Examiner*—Dawn Garrett
(74) *Attorney, Agent, or Firm*—H.C. Park & Associates, PLC

(57) ABSTRACT

An organic electroluminescent (EL) device including an organic EL unit sealed by an encapsulation layer comprising a layered inorganic substance/polymer/curing agent nanocomposite. The organic EL device according to the present invention may have a flat glass substrate.

14 Claims, 2 Drawing Sheets

OTHER PUBLICATIONS

Lincoln et al., "Revolutionary nanocomposite materials to enable space systems in the 21st Century", Aerospace Conference Proceedings, 2000 IEEE, (2000), vol. 4, p. 183-192.*

Chen et al., Nanotechnology, vol. 14, (2003), p. 643-648.*

Machine-generated translation of description section of JP 08-236271 published Sep. 1996.*

Chinese Office Action dated Jun. 6, 2008.

* cited by examiner

ORGANIC ELECTROLUMINESCENT DISPLAY DEVICE

CROSS REFERENCE TO RELATED APPLICATION

This application claims priority to and the benefit of Korean Patent Application No. 10-2004-0006586, filed on Feb. 2, 2004, which is hereby incorporated by reference for all purposes as if fully set forth herein.

BACKGROUND OF THE INVENTION

1. Field of the Invention

The present invention relates to an organic electroluminescent (EL) device, and more particularly, to an organic EL device that resists external moisture and oxygen permeation.

2. Description of the Background

Generally, moisture and oxygen deteriorate organic EL devices. Consequently, an encapsulation member may be required for an organic EL device to prevent moisture and oxygen permeation.

Conventional encapsulation methods include forming a cap-shaped metal can or glass that provides a recess for accommodating a powdered absorbent for absorbing water, and forming a film-type double-sided tape for adhesion (U.S. Pat. No. 5,771,562 and Japanese Laid-open Publication No. hei 03-261091). U.S. Pat. No. 6,268,695 discloses a method of forming a protective layer by alternately depositing an organic substance and an inorganic substance over an organic EL unit.

However, placing a desiccant powder in a recess may be complex and expensive. Additionally, forming the recess may increase a substrate's overall thickness, and a non-transparent encapsulating substrate prevents fabrication, of front emitting and dual (i.e. front/rear) emitting devices. Additionally, since etched glass used as the encapsulation member may be brittle, external impact may easily damage it. When passivation is achieved using films, moisture permeation may not be substantially prevented. Further, the film-type encapsulation member may have poor durability and low reliability because it may have limited capability to prevent moisture infiltration, and it may be easily torn during fabrication or use. Therefore, passivation using a film may not be suitable for mass production. The method of forming an organic/inorganic multi-layered protective layer may require alternately depositing organic thin films and inorganic thin films, and a glass or metal cap may be needed for encapsulation.

SUMMARY OF THE INVENTION

The present invention provides an organic EL device including an encapsulation layer that may prevent moisture and oxygen absorption, and a method for manufacturing the same.

Additional features of the invention will be set forth in the description which follows, and in part will be apparent from the description, or may be learned by practice of the invention.

The present invention discloses an organic EL device including an organic EL unit and an encapsulation layer comprising a layered inorganic substance/polymer/curing agent nanocomposite on the organic EL unit.

The present invention also discloses an organic EL device including an organic EL unit and an encapsulation layer comprising a layered inorganic substance/polymer nanocomposite on the organic EL unit.

The present invention also discloses a method for manufacturing an organic EL device including forming an organic EL unit on a first substrate, mixing a layered inorganic substance, a polymer, and a curing agent to form a nanocomposite forming composition, forming an encapsulation layer by applying the nanocomposite forming composition to a surface of a second substrate, and adhering the first substrate to the second substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
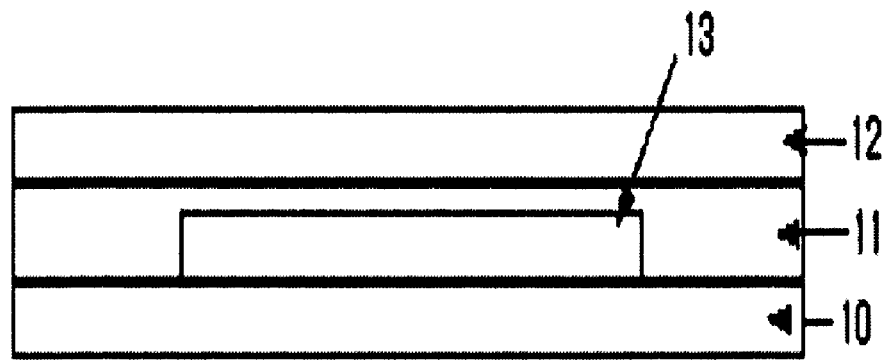
FIG. 1 is a cross-sectional view of an organic EL device according to an exemplary embodiment of the present invention.

An organic EL device according to an exemplary embodiment of the present invention may include a hermetically sealed organic EL unit and an encapsulation layer. The encapsulation layer contains an organic/inorganic substance nanocomposite, such as a layered inorganic substance/polymer nanocomposite or a layered inorganic substance/polymer/curing agent nanocomposite. The layered inorganic substance/polymer/curing agent nanocomposite may be prepared by mixing a layered inorganic substance, an inorganic substance such as a silane coupling agent, a polymer, and a curing agent.

In the layered inorganic substance/polymer/curing agent nanocomposite, the polymer and the curing agent, and/or a hardened reaction product of the polymer and the curing agent, may be intercalated in an interlayer of the layered inorganic substance, which may increase the thickness of the interlayer of the layered inorganic substance. Intercalation may be confirmed using X-ray diffraction (XRD). A surface of the layered inorganic substance may be substituted with a hydrophilic group, such as —$NH_2$. Such a layered inorganic substance may have a nano-sized interlayer distance. A layered inorganic substance with a surface substituted with a hydrophilic/hydrophobic group may be be easily mixed and intercalated with the polymer.

The layered inorganic substance may comprise a compound selected from a is layered silicate, organoclay, modified organoclay (e.g. Closite, Clatone, etc. in particular, Closite 30B, Closite 93A, Closite 15A, etc. with the trade name of U.S. Nanoclay Co.), montmorillonytril, kaoline, mica, quartz, illite, calcite, hydrated sodium calcium aluminum magnesium silicate hydroxide, pyrophyllite, talc, vermiculite, sauconite, saponite, nontronite, amesite, baileychlore, chamosite, clinochlore, kaemmererite, cookeite, corundophilite, daphnite, delessite, gonyerite, nimite, odinite, orthochamosite, penninite, pannantite, rhipidolite, prochlore, sudoite, thuringite, kaolinite, dickite, and nacrite.

The polymer may be epoxy resin, polystyrene, nylon, polyimide, epoxy silane, epoxy titania hybrid compound, epoxy zirconia, silanol, or other like substances. In this case, epoxy silane, epoxy titania hybrid compound, epoxy zirconia, silanol, or other like substances may contain an inorganic coupling agent. Thus, such a compound may react with a layered inorganic substance, such as a polymer filled in a layered silicate, to increase the amount of an inorganic substance to ensure excellent moisture and oxygen absorbing characteristics.

The polymer according to exemplary embodiments of the present invention may have an equivalent of 100-500, and particularly, 100-200. Such a low molecular weight polymer may have a relatively low viscosity and may be easily mixed with a layered silicate. Consequently, it may be easy to prepare the nanocomposite using a low molecular weight polymer.

The curing agent may be polyamide, a polyamide-based compound, an amine-based compound, an aliphatic amine-based compound, an alicyclic amine-based compound, or an aromatic amine-based compound. Specifically, the curing agent may be diethyltriamine, diethyltetramine, diethylaminopropylamine, methane diamine, N-aminoethyl piperaizne, m-xylene diamine, cyanoethylated polyamine, epoxy-polyamine, ethylene/propylene polyamine, metaphenyl diamine, dimethylaniline, diamino diphenylsulfone, or other like substances.

Hereinafter, an organic EL device according to an exemplary embodiment of the present invention will be described, wherein a layered silicate is used as the layered inorganic substance.

Figure 2:
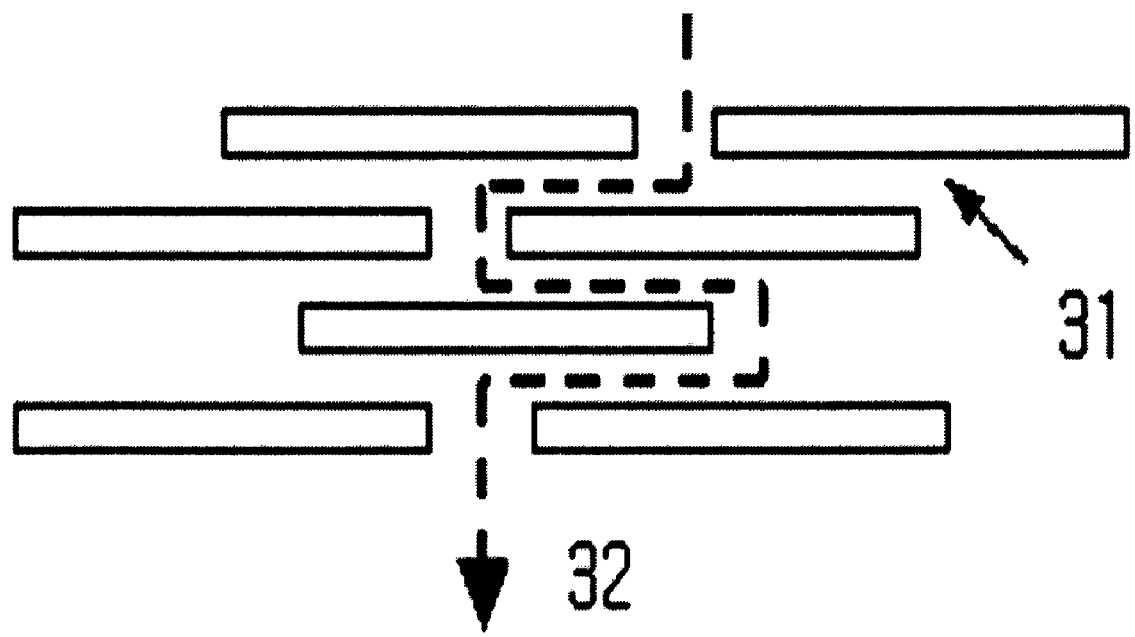
FIG. 2 shows a path of moisture and oxygen in an encapsulation layer.

An encapsulation layer used in the present exemplary embodiment may be formed by alternately depositing an organic polymer and a layered silicate. Therefore, when applying a force to the encapsulation layer in a printing process, the layered silicate may be orientated in the direction of a glass substrate due to such a plate structure. As a result, although a mean permeation path length of external moisture and oxygen increases, the surface of the layered silicate may, absorb moisture and oxygen, thus substantially decreasing the amount of permeated moisture and oxygen. Referring to FIG. 2, reference numeral 32 represents the mean permeation path length of moisture and oxygen, and reference numeral 31 represents a single layer comprising the layered inorganic substance/polymer/curing agent nanocomposite, and included in the encapsulation layer.

FIG. 1 is a cross-sectional view illustrating an organic EL device according to an exemplary embodiment of the present invention. Referring to FIG. 1, the organic EL device may include a rear substrate 10, an organic EL unit 13 formed on the rear substrate 10, and a front substrate 12 formed on an encapsulation layer 11.

The rear substrate 10 may be made of glass or a transparent insulator. The organic EL unit 13 may be formed by sequentially depositing a first electrode, an organic film, and a second electrode on the rear substrate 10. The front substrate 12 is coupled to the rear substrate 10 to hermetically seal an inner space of the organic EL device in which the organic EL unit 13 is placed, thereby isolating the organic EL unit 13 from the outside. The encapsulation layer 11 may comprise the layered silicate/polymer/curing agent nanocomposite. As FIG. 1 shows, the front substrate 12 may be coupled to the rear substrate 10 without an additional sealant.

The organic EL unit 13 may be formed by sequentially depositing a first electrode, an organic material, a second electrode using deposition, spin coating, laser radiation, bar coating, printing, or other like methods. The organic film may include a hole injection layer, a hole transporting layer, a light emitting layer, an electron injection layer, or an electron transporting layer.

The encapsulation layer may be about 30 μm to about 500 μm thick, but it is preferably about 100 μm to about 30 μm thick. When the encapsulation layer is less than 30 μm thick, its capability to absorb moisture and oxygen may decrease. When it is thicker than 500 μm, an undesirable stress of the device may increase.

The layered inorganic substance/polymer nanocomposite or the layered inorganic substance/polymer/curing agent nanocomposite may have major peaks in terms of Bragg's 2θ angle to the Cuk-α characteristic X-ray wavelength at 1.541 Å at least at 1.67±0.3° and 5.1±0.3°.

A method of manufacturing an organic EL device including an encapsulation layer composed of the layered inorganic substance/polymer/curing agent nanocomposite according to an exemplary embodiment of the present invention will now be described.

First, an organic EL unit, which may be formed by sequentially depositing a first electrode, an organic film, and a second electrode, may be formed on a rear substrate.

Then, a layered inorganic substance and a polymer may be mixed using a polymer mixing device, such as a Brabender mixer. A curing agent may then be added to the mixture to prepare a nanocomposite forming composition. When mixing, the mixer may rotate at a speed of 50-150 rpm at 25-60° C., and preferably 40° C.

The nanocomposite forming composition may be applied to an inner surface of a front substrate to form an encapsulation layer. Herein, the term 'applied' does not limit a way for providing the composition. The nanocomposition may be applied to the inner surface of the front substrate by contact printing, non-contact printing, bar coating, spin coating, or other like methods.

Next, the rear substrate may be adhered to the front substrate and heat-treated at a temperature in the range of about 20° C. to about 150° C., and preferably, in the range of 60° C. to 100° C. When the heat treatment process is performed at a temperature greater than 150° C., the organic film may undesirably deteriorate. When, performed at a temperature of less than 20° C., the heat treatment process may be undesirably prolonged.

If the layered inorganic substance is dispersed using a solvent, a pretreatment process may be performed to evaporate a small amount of the solvent before adhering the rear substrate to the front substrate.

A curing reaction may occur between the polymer and the curing agent during heat treating. Consequently, the polymer, the curing agent and/or the reaction product of the polymer and the curing agent may be intercalated in an interlayer of the inorganic substance.

The nanocomposite forming composition may include about 10-30 parts by weight of the curing agent, and about 70-900 parts by weight of the layered inorganic substance, based on 100 parts by weight of the polymer. When the amount of the curing agent is outside of the range, the curing reaction time may be too long. When the amount of the layered inorganic substance is outside of the range, the capability to absorb moisture and oxygen may deteriorate.

The nanocomposite forming composition may further include a solvent that may disperse the layered inorganic substance. When using the solvent, the nanocomposite forming composition may include up to about 50-90 parts by weight of the layered silicate based on 100 parts by weight of the nanocomposite forming composition. The increased layered silicate may improve moisture and oxygen absorbing capability. The solvent, which may be a polar solvent or a non-polar solvent, may be ethanol, methoxyethanol, ethylacetate, dimethylformamide, toluene, acetone, benzene, heptane, hexane, or other like substances. The amount of the solvent may vary. However, the amount of the solvent may be about 100-500 parts by weight based on 100 parts by weight of the polymer.

In the organic EL device, as shown in FIG. 1, a non-etched glass (that is, flat glass) may be used as encapsulation glass. In this case, flat, non-etched glass has no groove. Additionally, the organic EL device according to an exemplary embodiment of the present invention may exhibit excellent moisture and oxygen absorption characteristics compared to a conventional organic EL device, even when not using a CaO or BaO desiccant and a sealant.

Exemplary embodiments of the present invention will now be described in further detail with reference to the following examples. The following examples are for illustrative purposes and are not intended to limit the scope of the present invention.

EXAMPLE 1

26 parts by weight of a layered silicate substituted with a hydrophilic group (Cloisite 30B obtained from U.S. Nanoclay Co.), and 74 parts by weight of a low molecular weight epoxy resin YD114 (obtained from Kukdo Chemical Co., Ltd.) were mixed using a Brabenda mixer at a rotational speed of 150 rpm, at 40° C., for 20 minutes.

KH818 (obtained from Kukdo Chemical Co., Ltd.) was added to the mixture to prepare an encapsulation forming composition. The composition was coated on a soda glass substrate using bar coating, and then dried. Then, the coated substrate was adhered to a glass substrate, on which a first electrode, an organic film, and a second electrode were formed. The result was heat-treated at 100° C. to complete an organic EL device.

EXAMPLE 2

An organic EL device was manufactured in the same manner as in Example 1, except that the encapsulation layer forming composition included 30 parts by weight of the layered silicate substituted with a hydrophilic group and 25 parts by weight of S510 (KENRICH) instead of the 26 parts by weight of the layered silicate substituted with a hydrophilic group.

EXAMPLE 3

An organic EL device was manufactured in the same manner as in Example 1, except that the encapsulation layer forming composition included 65 parts by weight of the layered silicate substituted with a hydrophilic group instead of the 26 parts by weight of the layered silicate substituted with a hydrophilic group. In this case, the layered silicate substituted with a hydrophilic group was prepared by dispersing 80 parts by weight of the layered silicate substituted with a hydrophilic group in 20 parts by weight of 2-methoxyethanol.

EXAMPLE 4

An organic EL device was manufactured in the same manner as in Example 1, except that the encapsulation layer forming composition included 60 parts by weight of the layered silicate substituted with a hydrophilic group instead of 26 parts by weight of the layered silicate substituted with a hydrophilic group. In this case, the layered silicate substituted with a hydrophilic group was prepared by dispersing 80 parts by weight of the layered silicate substituted with a hydrophilic group in 20 parts by weight of ethyl acetate.

EXAMPLE 5

An organic EL device was manufactured in the same manner as in Example 1, except that the encapsulation layer forming composition included 65 parts by weight of the layered silicate substituted with a hydrophilic group instead of 26 parts by weight of the layered silicate substituted with a hydrophilic group. In this case, the layered silicate substituted with a hydrophilic group was prepared by dispersing 80 parts by weight of the layered silicate substituted with a hydrophilic group in 20 parts by weight of acetone.

EXAMPLE 6

An organic EL device was manufactured in the same manner as in Example 1, except that the encapsulation layer forming composition included 78 parts by weight of the layered silicate substituted with a hydrophilic group instead of 26 parts by weight of the layered silicate substituted with a hydrophilic group. In this case, the layered silicate substituted with a hydrophilic group was prepared by dispersing 90 parts by weight of the layered silicate substituted with a hydrophilic group in 10 parts by weight of 2-methoxyethanol.

EXAMPLE 7

An organic EL device was manufactured in the same manner as in Example 1, except that a low molecular weight epoxy resin YD115 (obtained from Kukdo Chemical Co., Ltd.) was used instead of the low molecular weight epoxy resin YD114.

EXAMPLE 8

An organic EL device was manufactured in the same manner as in Example 1, except that a low molecular weight epoxy resin YD128 (obtained from Kukdo Chemical Co., Ltd.) was used instead of the low molecular weight epoxy resin YD114.

EXAMPLE 9

An organic EL device was manufactured in the same manner as in Example 1, except that a low molecular weight epoxy resin YD128S (obtained from Kukdo Chemical Co., Ltd.) was used instead of the low molecular weight epoxy resin YD114.

EXAMPLE 10

An organic EL device was manufactured in the same manner as in Example 1, except that montmorillonyltril was used instead of the layered silicate substituted with a hydrophilic group.

EXAMPLE 11

An organic EL device was manufactured in the same manner as in Example 1, except that calcite was used instead of the layered silicate substituted with a hydrophilic group.

Table 1 shows the results of water and oxygen permeation tests performed on the organic EL devices of Examples 1-6.

TABLE 1

| | Amount of layered silicate (parts by weight) | WVTR[1] (g/m2/day) | OTR[2] (cc/m2/day) | Film thickness (μm) | |
|---|---|---|---|---|---|
| Blank | 26 | 43.8 | 247.86 | 100 | Without encapsulation layer |
| Example 1 | 26 | 30.90 | 59.84 | 70 | |
| Example 2 | 55 | 12.06 | 32.20 | 120 | Addition of S510 siliane coupling agent |
| Example 3 | 65 | 4.12 | 11.20 | 200 | Dispersion using 2-methoxyethanol |
| Example 4 | 60 | 5.49 | 11.09 | 120 | Dispersion using ethylacetate |
| Example 5 | 65 | 9.02 | 35.7 | 70 | Dispersion using acetone |
| Example 6 | 78 | 16.65 | 46.2 | 70 | Dispersion using 2-methoxyethanol |

[1]37.8° C., 100% RH (Mocon Co.)
[2]23.0° C., 100% $O_2$ concentration (Mocon oxtran Co.)

Figure 3:
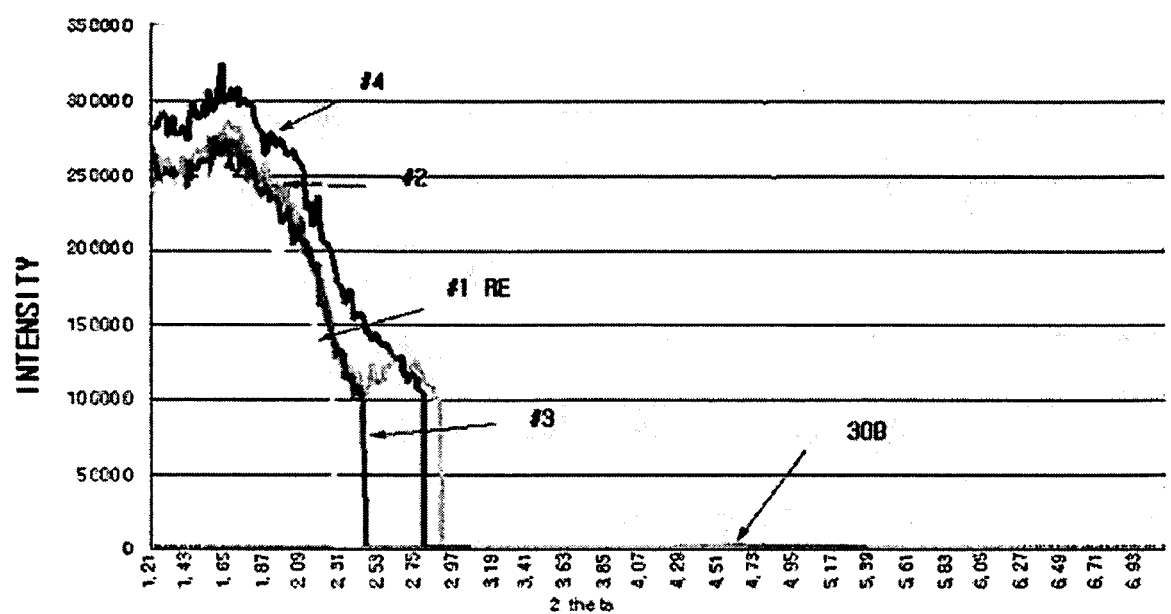
FIG. 3 shows the results of X-ray diffraction of encapsulation layers produced according to Examples 1, 7, 8 and 9.

Also, an X-ray diffraction experiment was carried out on encapsulation layers containing a nanocomposite formed according to Examples 1, 7, 8, and 9. Table 2 and FIG. 3 show the results. Referring FIG. 3, 30B indicates the X-ray diffraction result is Closite 30B, #1 RE denotes the result of Example 1, where Closite 30B was used as a material for forming encapsulation layer, #2 denotes the result of Example 7, #3 denotes the result of Example 8, and #4 denotes the result of Example 9.

TABLE 2

| | Composition of layered inorganic substance and polymer | First peak (Å) | Second peak (Å) |
|---|---|---|---|
| Example 1 | YD114 + Cloisite 30B | 1.61-54.656 | 4.95-17.85 |
| Example 7 | YD115 + Cloisite 30B | 1.68-52.337 | 5.17-17.07 |
| Example 8 | YD128 + Cloisite 30B | 1.60-54.847 | 5,14-17.17 |
| Example 9 | YD128S + Cloisite 30B | 1.73-50.9444 | 4.97-17.78 |
| Cloisite 30B | — | 4.83-18.285 | X |
| Cloisite Na + type | | 7.25-12.171 | X |

As Table 2 and FIG. 3 show, in the case where the encapsulation layer included only Closite 30B, the maximum interlayer distance increased from 18.285 (Å) to 50-55 (Å), which implies the occurrence of intercalation.

Lifetime characteristics of the organic EL devices according to Examples 1-6 were identified, and the lifetime of an organic EL device including an encapsulation layer may significantly increase as compared to that of an organic EL device without an encapsulation layer. According to exemplary embodiments of the present invention, an encapsulating layer, which has excellent moisture and oxygen-absorbing characteristics, may be used to fill a space between a front substrate and a rear substrate. In a conventional encapsulating method, an edge of glass/substrate may be coated with an organic sealant to form a space between a front substrate and a rear substrate. Consequently, an additional material may be used to absorb moisture and oxygen permeated from outside. However, in an organic EL device according to exemplary embodiments of the present invention, using a nanocomposite encapsulation layer may improves the device's lifetime.

An organic EL device according to exemplary embodiments of the present invention may be made of a flat glass substrate. As a result, structural weakness, which may appear when using a conventional etched glass, may be prevented, and further, a polymer sealant layer is not required. Therefore, the organic EL device may better withstand external impact, and it may be lightweight and thin. Additionally, the organic EL device may be hermetically sealed using an encapsulation layer having excellent moisture and oxygen absorbing characteristics, and a conventional desiccant and sealant are not needed. As a result, the lifetime of the organic EL device may increase. Another benefit, of the present invention is that a uniform encapsulation layer having a large surface area may be formed using one-time coating or printing.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic EL device, comprising:
    a front substrate;
    a rear substrate;
    an organic EL unit disposed on the rear substrate; and
    an encapsulation layer comprising a layered inorganic substance/polymer/curing agent nanocomposite encapsulating the organic EL unit,
    wherein the encapsulation layer contacts the front substrate and the rear substrate to seal the space between the front substrate and the rear substrate, and
    wherein a surface of the layered inorganic substance is substituted with a hydrophilic group.

2. The organic EL device of claim 1, wherein the layered inorganic substance/polymer/curing agent nanocomposite is formed by intercalating a mixture of a polymer and a curing agent, or a reaction product of the mixture, in an interlayer of the inorganic substance.

3. The organic EL device of claim 1, wherein the layered inorganic substance is at least a compound selected from the group consisting of a layered silicate, organoclay, modified organoclay, montmorillonytril, kaoline, mica, quartz, illite, calcite, hydrated sodium calcium aluminum magnesium silicate hydroxide, pyrophyllite, talc, vermiculite, sauconite, saponite, nontronite, amesite, baileychlore, chamosite, clinochlore, kaemmererite, cookeite, corundophilite, daphnite, delessite, gonyerite, nimite, odinite, orthochamosite, penninite, pannantite, rhipidolite, prochlore, sudoite, thuringite, kaolinite, dickite, and nacrite.

4. The organic EL device of claim 1, wherein the polymer is selected from the group consisting of epoxy resin, epoxy silane, epoxy titania hybrid compound, epoxy zirconia, polystyrene, nylon, polyimide, and silanol.

5. The organic EL device of claim 1, wherein the encapsulation layer is about 30 µm to about 500 µm thick.

6. The organic EL device of claim 1, wherein the layered inorganic substance/polymer/curing agent nanocomposite has major peaks in terms of Bragg's 2θ angle to the Cuk-α characteristic X-ray wavelength at 1.541 Å at least at 1.67±0.3° and 5.1±0.3°.

7. An organic EL device, comprising:
a front substrate;
a rear substrate;
an organic EL unit disposed on the rear substrate; and
an encapsulation layer comprising a layered inorganic substance/polymer nanocomposite encapsulating the organic EL unit,
wherein the encapsulation layer contacts the front substrate and the rear substrate to seal the space between the front substrate and the rear substrate, and
wherein a surface of the layered inorganic substance is substituted with a hydrophilic group.

8. The organic EL device of claim 7, wherein the layered inorganic substance is at least a compound selected from the group consisting of a layered silicate, organoclay, modified organoclay, montmorillonytril, kaoline, mica, quartz, illite, calcite, hydrated sodium calcium aluminum magnesium silicate hydroxide, pyrophyllite, talc, vermiculite, sauconite, saponite, nontronite, amesite, baileychlore, chamosite, clinochlore, kaemmererite, cookeite, corundophilite, daphnite, delessite, gonyerite, nimite, odinite, orthochamosite, penninite, pannantite, rhipidolite, prochlore, sudoite, thuringite, kaolinite, dickite, and nacrite.

9. The organic EL device of claim 7, wherein the layered inorganic substance/polymer nanocomposite has major peaks in terms of Bragg's 2θ angle to the Cuk-α characteristic X-ray wavelength at 1.541 Å at least at 1.67±0.3° and 5.1±0.3°.

10. The organic EL device of claim 7, wherein the polymer is selected from the group consisting of epoxy resin and epoxy silane.

11. The organic EL device of claim 1, wherein the front substrate comprises a flat, non-etched glass substrate.

12. The organic EL device of claim 11, wherein the encapsulation layer completely fills the space between the front substrate and the rear substrate having the organic EL unit disposed thereon.

13. The organic EL device of claim 7, wherein the front substrate comprises a flat, non-etched glass substrate.

14. The organic EL device of claim 13, wherein the encapsulation layer completely fills the space between the front substrate and the rear substrate having the organic EL unit disposed thereon.

* * * * *

UNITED STATES PATENT AND TRADEMARK OFFICE
CERTIFICATE OF CORRECTION

| | | |
|---|---|---|
| PATENT NO. | : 7,659,012 B2 | Page 1 of 1 |
| APPLICATION NO. | : 11/046797 | |
| DATED | : February 9, 2010 | |
| INVENTOR(S) | : Kim et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 573 days.

Signed and Sealed this

Thirtieth Day of November, 2010

David J. Kappos
*Director of the United States Patent and Trademark Office*